United States Patent
Gu

(10) Patent No.: US 12,037,526 B2
(45) Date of Patent: Jul. 16, 2024

(54) SUPPORT FILM, OLED DISPLAY STRUCTURE AND MANUFACTURING METHOD THEREOF

(71) Applicant: BOE TECHNOLOGY GROUP CO., LTD., Beijing (CN)

(72) Inventor: Penghao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 94 days.

(21) Appl. No.: 17/763,195

(22) PCT Filed: May 21, 2021

(86) PCT No.: PCT/CN2021/095142
§ 371 (c)(1),
(2) Date: Mar. 23, 2022

(87) PCT Pub. No.: WO2021/238793
PCT Pub. Date: Dec. 2, 2021

(65) Prior Publication Data
US 2022/0340787 A1 Oct. 27, 2022

(30) Foreign Application Priority Data

May 27, 2020 (CN) .......................... 202010463440.6

(51) Int. Cl.
*B32B 37/12* (2006.01)
*B32B 7/06* (2019.01)
(Continued)

(52) U.S. Cl.
CPC ................. *C09J 7/401* (2018.01); *B32B 7/06* (2013.01); *B32B 7/12* (2013.01); *B32B 27/36* (2013.01); *B32B 37/12* (2013.01); *B32B 38/0004* (2013.01); *B32B 38/10* (2013.01); *C09J 5/00* (2013.01); *C09J 7/255* (2018.01); *C09J 7/29* (2018.01); *C09J 7/385* (2018.01);
(Continued)

(58) Field of Classification Search
CPC .. G09F 9/301; H10K 2102/311; H10K 71/00; B32B 2457/206; B32B 37/12; B32B 38/0004; B32B 38/10; C09J 2203/326
See application file for complete search history.

(56) References Cited

U.S. PATENT DOCUMENTS

| | | |
|---|---|---|
| 2017/0125729 A1 | 5/2017 | Kim |
| 2019/0326529 A1 | 10/2019 | Xie et al. |
| 2021/0050534 A1 | 2/2021 | Yang et al. |

FOREIGN PATENT DOCUMENTS

| | | |
|---|---|---|
| CN | 108538762 A | 9/2018 |
| CN | 108962031 A | 12/2018 |

(Continued)

OTHER PUBLICATIONS

China Patent Office, First Office Action dated Jul. 26, 2022, Chinese application No. 202010463440.6.

*Primary Examiner* — Carson Gross
(74) *Attorney, Agent, or Firm* — HOUTTEMAN LAW LLC

(57) ABSTRACT

The present disclosure discloses a support film, an OLED display structure and a manufacturing method thereof. The support film includes a first adhesive material layer and a first base material layer, which are stacked together, and a first release film therebetween.

10 Claims, 5 Drawing Sheets

(51) Int. Cl.
  *B32B 7/12*     (2006.01)
  *B32B 27/36*    (2006.01)
  *B32B 38/00*    (2006.01)
  *B32B 38/10*    (2006.01)
  *C09J 5/00*     (2006.01)
  *C09J 7/25*     (2018.01)
  *C09J 7/29*     (2018.01)
  *C09J 7/38*     (2018.01)
  *C09J 7/40*     (2018.01)
  *H10K 50/87*    (2023.01)
  *H10K 71/00*    (2023.01)
  *B32B 37/26*    (2006.01)
  *H10K 102/00*   (2023.01)

(52) U.S. Cl.
  CPC ............ *H10K 50/87* (2023.02); *H10K 71/00* (2023.02); *B32B 2037/268* (2013.01); *B32B 2457/206* (2013.01); *C09J 2203/326* (2013.01); *C09J 2433/00* (2013.01); *C09J 2467/006* (2013.01); *C09J 2483/005* (2013.01); *H10K 2102/311* (2023.02)

(56) References Cited

FOREIGN PATENT DOCUMENTS

| | | | |
|---|---|---|---|
| CN | 109873020 A | 6/2019 | |
| CN | 110444665 A | 11/2019 | |
| CN | 110570754 A | 12/2019 | |
| CN | 110767083 A * | 2/2020 | ............ G09F 9/301 |
| CN | 110767083 A | 2/2020 | |
| CN | 111179757 A | 5/2020 | |
| CN | 111187576 A | 5/2020 | |
| CN | 111584714 A | 8/2020 | |
| WO | WO2014190151 * | 11/2014 | ............ B32B 27/00 |

* cited by examiner

SUPPORT FILM, OLED DISPLAY STRUCTURE AND MANUFACTURING METHOD THEREOF

CROSS REFERENCE TO RELATED APPLICATIONS

The present application claims the priority of the Chinese Patent Application No. 202010463440.6 filed on May 27, 2020, the content of which is incorporated herein by reference in its entirety.

TECHNICAL FIELD

The present disclosure relates to the field of display panels, and in particular to a support film, an OLED display structure and a manufacturing method thereof.

BACKGROUND

An Organic Light Emitting Diode (OLED) display apparatus gradually becomes the first choice for a screen, and has many advantages such as self-luminescence, high light emitting efficiency, short response time, high definition and high contrast, and the like, and it may also ensure that its screen has certain flexibility and adaptability. With the development of flexible display screens, people have increasingly high expectations for foldable and curving display products.

SUMMARY

The present disclosure provides a support film, an OLED display structure and a manufacturing method thereof.

In a first aspect, a support film is provided to include a first adhesive material layer and a first base material layer stacked together, and a first release film between the first base material layer and the first adhesive material layer.

In some embodiments, the first release film is made of silicone oil; the first adhesive material layer is made of acrylic resins; and the first base material layer is made of polyethylene terephthalate.

In some embodiments, the support film further includes a protective base material layer on a side of the first adhesive material layer away from the first base material layer, and a protective film on a side of the first base material layer away from the first adhesive material layer.

In some embodiments, the support film further includes a second release film between the protective base material layer and the first adhesive material layer, wherein the second release film is made of silicone oil; and the protective base material layer is made of polyethylene terephthalate or polyimide.

In some embodiments, the support film further includes an opening extending through the first base material layer, the first release film, the first adhesive material layer.

In some embodiments, the first base material layer has a thickness in a range of 25 μm to 100 μm.

In some embodiments, the first base material layer has a thickness of 50 μm. In a second aspect, a method for fabricating an OLED display structure is provided, which includes steps of: providing the above support film; attaching the support film to an OLED display device layer, wherein the OLED display device layer includes a display region and a bending region; tearing off a portion of the first base material layer corresponding to the display region; and attaching a second base material layer at the position on the first adhesive material layer corresponding to the display region where the portion of the first base material layer is torn-off, wherein the second base material layer is made of a different material from that of the first base material layer.

In some embodiments, prior to tearing off the portion of the first base material layer on the support film corresponding to the display region, the manufacturing method of an OLED display structure further includes steps of: cutting the first base material layer of the support film into: a first portion corresponding to the display region and a portion of the bending region, and a second portion corresponding to a remaining portion of the bending region; and tearing off the first portion; wherein the step of attaching a second base material layer at the position on the first adhesive material layer corresponding to the display region where the portion of the first base material layer is torn-off, includes: attaching the second base material layer, such that the second base material layer and the second portion of the first base material layer are spaced apart from each other.

In some embodiments, a protective base material layer is disposed on a side of the first adhesive material layer away from the first base material layer, and a protective film is disposed on a side of the first base material layer away from the first adhesive material layer, wherein prior to attaching the support film to the OLED display device layer, the manufacturing method of an OLED display structure further includes: tearing off the protective base material layer; and wherein prior to tearing off a portion of the first base material layer corresponding to the display region, the manufacturing method of an OLED display structure further includes: tearing off the protective film.

In some embodiments, the OLED display device layer includes a functional film layer, a first optical adhesive layer and a window film layer sequentially arranged and in the display region.

In some embodiments, after attaching a second base material layer at the position on the first adhesive material layer corresponding to the display region where the portion of the first base material layer is torn-off, the manufacturing method of an OLED display structure further includes steps of: attaching a heat dissipation member to a side of the second base material layer away from the OLED display device layer, and attaching a double-sided adhesive layer to a side of the heat dissipation member away from the OLED display device layer; tearing off the remaining portion of the first base material layer; and bending the bending region of the OLED display device layer, wherein the first adhesive material layer and the double-sided adhesive layer are adhered together; wherein a second adhesive material layer is attached to the outside of a bent portion of the OLED display device layer corresponding to the bending region.

In some embodiments, the first base material layer is made of polyethylene terephthalate, and the second base material layer is made of metal or polymer.

In a third aspect, an OLED display structure is provided, which includes the above support film.

BRIEF DESCRIPTION OF DRAWINGS

Other features, objects and advantages of the present disclosure will become more apparent upon reading the detailed description of non-limiting embodiments made with reference to the following drawings.

DETAIL DESCRIPTION OF EMBODIMENTS

Figure 1A:
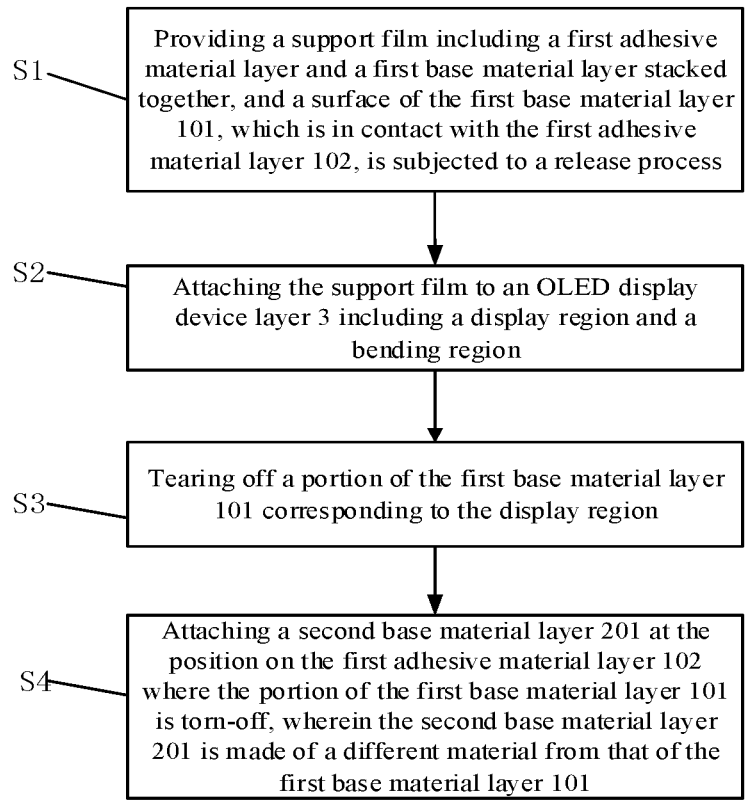
FIG. 1a is a flowchart of a method for manufacturing an OLED display structure according to the embodiment of the present disclosure.

At present, film layers of a flexible display screen generally include a cover plate, a module functional film layer, a light emitting film layer, a back plate film layer, a flexible substrate, a back support film layer, and the like.

In a flexible display apparatus, a support film has a protection function and provides respective mechanical properties under a display screen. At present, the support film is generally made of Polyethylene terephthalate (PET) material or Polyimide (PI) material, each of which has an elasticity modulus in a range of 1 GPa to 10 GPa and has good optical properties (at least 30% light transmittance or more). However, with requirements on various types of structural designs and different functions and performances, a base material of the support film is accordingly required to have a high elasticity modulus (up to 100 GPa to 400 Gpa) and possibly without a light transmittance. There is also some demand for the base material of the support film with an ultra-low elasticity modulus (as low as 10 Mpa to 500 Mpa). Compared with existing materials, moduli of the above materials are too different, and the light transmittance cannot be met under thermal and optical requirements, which will cause difficulties to binding and related identification processes, and therefore the support film cannot be applied.

A traditional solution is as follows: a regional support film is designed, and stable PET and adhesive materials are used in a binding region. To achieve folding/curving and other higher requirements, the base material needs to be replaced. Since most of the conventional support films are designed to be pre-grooved (be provided with grooves in advance) to meet the bending requirements for a circuit region, the solution in which one-piece rolling material is processed is employed by a supplier to achieve the mass production. In a case where splicing is required, the rolling material cannot be pre-shaped, and has difficult to be processed.

The present disclosure is further described in detail below with reference to the drawings and embodiments. It is to be understood that the specific embodiments described herein are merely used to interpret and not to limit the present disclosure. It should be further noted that for the convenience of description, only portions relevant to the present disclosure are shown in the drawings.

It should be noted that embodiments in the present disclosure and their features may be combined with each other without conflict. The present disclosure will be described in detail below with reference to the drawings in conjunction with embodiments.

FIG. 1a is a flowchart of a method for manufacturing an OLED display structure according to an embodiment of the present disclosure. Referring to FIG. 1a together with FIGS. 2 to 13, an embodiment of the present disclosure provides a method for manufacturing an OLED display structure, including the following steps S1 to S4:

Step S1, providing a support film, wherein the support film includes a first adhesive material layer 102 and a first base material layer 101 which are stacked together, and a surface of the first base material layer 101, which is in contact with the first adhesive material layer 102, is subjected to a release process;

Step S2, attaching the support film to an OLED display device layer 3, wherein the OLED display device layer 3 includes a display region and a bending region;

Step S3, tearing off a portion of the first base material layer 101 corresponding to the display region;

Step S4, attaching a second base material layer 201 at the position on the first adhesive material layer 102 where the portion of the first base material layer 101 is torn-off, wherein the second base material layer 201 is made of a different material from that of the first base material layer 101.

In the embodiment of the present disclosure, the surface of the first base material layer 101, which is in contact with the first adhesive material layer 102, being subjected to the release process, means that: a release agent is coated on the surface of the first base material layer 101 in contact with the first adhesive material layer 102, and then, the first base material layer 101 and the release agent are cured together. In the embodiment of the present disclosure, the material of the first adhesive material layer is coated on the surface of the first base material layer 101 which has been subjected to the release process, or the first base material layer 101, which has been subjected to the release process, is attached to the first adhesive material layer 102 in a roll-to-roll manner, so that the first adhesive material layer 102 and the first base material layer 101 are stacked together, and a first release film 103 is formed between the first adhesive material layer 102 and the first base material layer 101, as shown in FIG. 2.

In the embodiment of the present disclosure, the release agent may be a siliceous treatment agent, typically silicone oil. In the embodiment of the present disclosure, the first adhesive material layer 102 is made of acrylic resin.

In the embodiment of the present disclosure, the support film is provided to include the adhesive material layer and the base material layer, between which the release process is performed such that the adhesive force between the adhesive material layer and the base material layer meets requirements to fall into a certain range, thereby meeting the requirements for a peeling-off process better to avoiding a potential risk. In this way, the base material layer of the support film in the display region may be replaced according to a corresponding requirement for the folding/curving design, thereby providing a process route and implementation for forming the regional back film.

Figure 2:
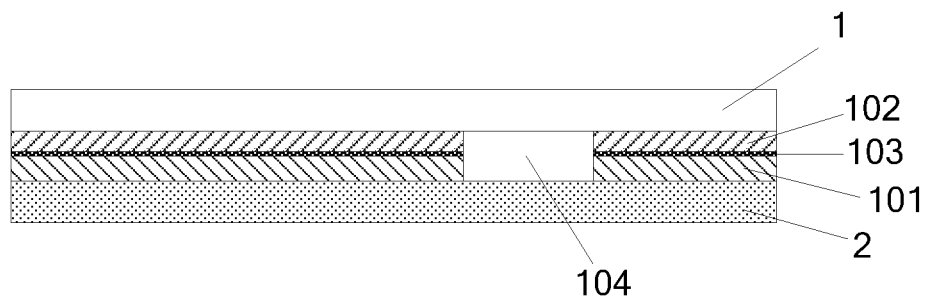
FIG. 2 shows a schematic diagram of a structure of a support film with an opening according to an embodiment of the present disclosure.

FIG. 2 is a schematic diagram of a structure of a support film. The support film includes the first adhesive material layer 102 and the first base material layer 101 stacked together between which a slightly weaker release process is performed. Specifically, the first release film 103 is formed between the first adhesive material layer 102 and the first base material layer 101 with the release process therebetween, as shown in FIG. 2.

In the embodiment of the present disclosure, the material of the first release film 103 is silicone oil.

Compared with the adhesive force between the first adhesive material layer and the first base material layer being of 1500 gf/Inch or more in the related art, in the embodiment of the present disclosure, the adhesive force (or peeling-off force or bonding force) between the first adhesive material layer and the first base material layer is only in a range of 5 gf/Inch to 20 gf/Inch due to the presence of the first release film 103, so that the above effect may be realized with the sufficient precision when the support film is formed, and a frame may be narrower and the process feasibility is high. In the process for manufacturing the OLED display structure, the support film is directly used with the adhesive force in the above range, such that the requirement for subsequent processes are met better, and the first base material layer is easily torn off from the first adhesive material layer, thereby facilitating replacing the first base material layer more conveniently. Further, according to different requirements, a part of the first base material layer in the display region may be replaced in subsequent processes, for meeting more process requirements for the folding/curving design.

Further, as shown in FIG. 2, a protective base material layer 1 is arranged on a side of the first adhesive material layer 102 away from the first base material layer 101, and a protective film 2 is arranged on a side of the first base material layer 101 away from the first adhesive material layer 102.

In the embodiment of the present disclosure, before attaching the support film to the OLED display device layer 3, the method for manufacturing an OLED display structure further includes tearing off the protective base material layer 1. In the embodiment of the present disclosure, in step S2, the step of attaching the support film to the OLED display device layer 3 includes attaching the first adhesive material layer 102 to the OLED display device layer 3 on a side away from the first base material layer 101.

In the embodiment of the present disclosure, before tearing off a portion of the first base material layer 101 on the support film corresponding to the display region, the method for manufacturing an OLED display structure further includes tearing off the protective film 2.

In the embodiment of the present disclosure, a surface of the protective base material layer 1 in contact with the first adhesive material layer 102 is subjected to a release process. Then, a second release film (not shown) is formed between the protective base material layer 1 and the first adhesive material layer 102. In the embodiment of the present disclosure, a material of the second release film is silicone oil. In the embodiment of the present disclosure, a material of the protective base material layer 1 is a polymer material, such as PET, PI, and the like.

The protective base material layer 1 and the protective film 2 are attached to two opposite outer sides of the support film (i.e., a side of the first adhesive material layer 102 away from the first base material layer 101, and a side of the first base material layer 101 away from the first adhesive material layer 102), respectively, and are torn off in subsequent processes. The adhesive force between the protective base material layer 1 and the first adhesive material layer 102 is in a range of 0 to 5 gf/Inch, thereby easily tearing off the protective base material layer 1 in the subsequent process. After the protective base material layer 1 is torn off, the OLED display device layer 3 is attached at the position on the first adhesive material layer 102 where the protective base material layer 1 is torn-off. The OLED display device layer includes the display region and the bending region.

The existing first base material layer is usually made of PET, and has an elasticity modulus between 1 Gpa and 8 Gpa, and thus, does not have a high resilience, and has a poor tensile, so that the first base material layer needs to be replaced during the folding/curving design for a screen. The first base material layer is replaced by the second base material layer made of a metal material or a polymer material, and an elasticity modulus (a high elasticity modulus (100 Gpa to 400 Gpa) or a low elasticity modulus (10 Mpa to 500 Mpa)) of the second base material layer may be selected according to actual conditions. The replaced second base material layer and the first adhesive material layer have an adhesive force of 500 gf/Inch or more therebetween.

In the embodiment of the present disclosure, a functional film layer 4, a first optical adhesive layer 5, and a window film layer 6 are sequentially disposed on the OLED display device layer 3 and in the display region.

Figure 3:
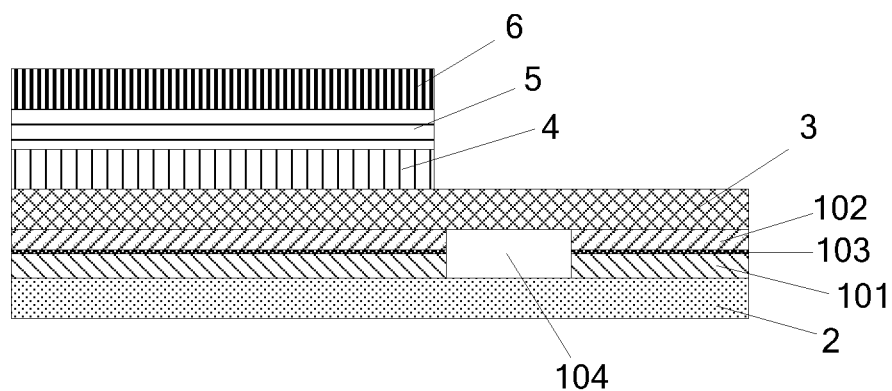
FIGS. 3 to 9 are schematic diagrams illustrating a process for manufacturing an OLED display structure according to an embodiment of the present disclosure, in which a support film has an opening therein.

As shown in FIG. 3, the functional film layer 4 disposed on the OLED display device layer includes, for example, a touch layer and a polarizer. The functional film layer 4, the first optical adhesive layer 5, and the window film layer 6 are disposed in the display region. After the OLED display device layer 3 has been attached to the support film, subsequent processes are performed. The window film layer 6 is used for protecting the OLED display device layer.

Figure 4:
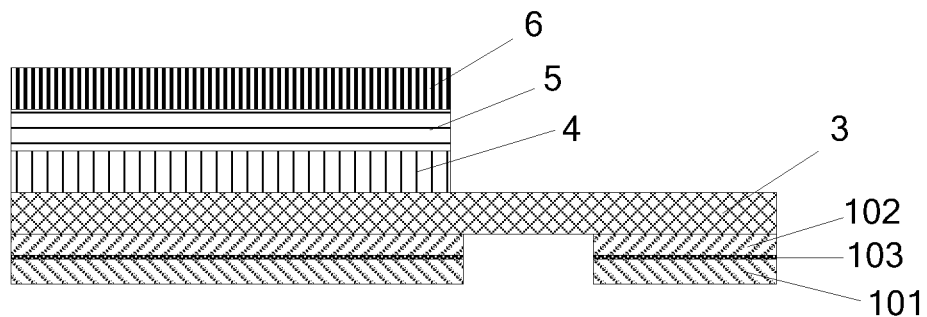
Figure 5:
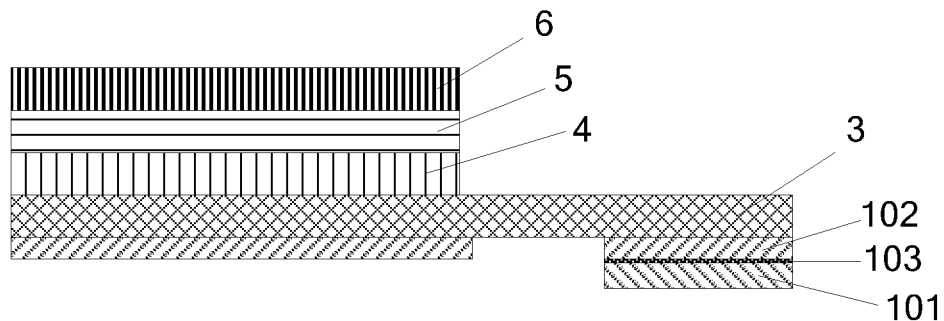
Figure 6:
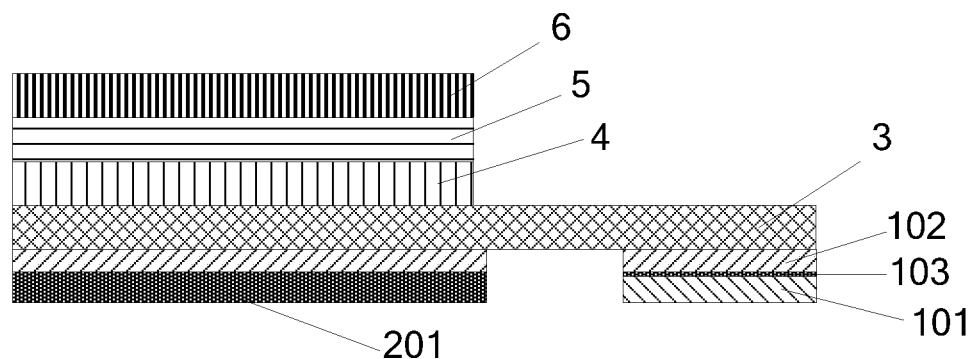

FIGS. 4 to 6 show steps of replacing a portion of the first base material layer. FIG. 4 is a schematic diagram showing a structure with the protective film torn off. Subsequently, FIG. 5 is a schematic diagram showing a structure with the portion of the first base material layer on the support film corresponding to the display region torn off. Specifically, the step of tearing off a portion of the first base material layer on the support film corresponding to the display region includes tearing off a portion of the first base material layer intended to be torn off by bonding using a roller. Subsequently, FIG. 6 is a schematic diagram showing a structure with the second base material layer attached at the position on the first adhesive material layer where the portion of the first base material layer is torn-off. In this way, a portion of the base material layer of the support film is replaced by the second base material layer 201 to meet some requirements.

In the embodiment of the present disclosure, the second base material layer 201 has a thickness equal to that of the first base material layer 101. The present disclosure is not limited to this. In other embodiments of the present disclosure, the thickness of the second base material layer may also be different from that of the first base material layer, because after the cover plate of the OLED display structure is attached, an adverse effect due to a subsequent height difference is not necessarily considered.

In the embodiment of the present disclosure, the first base material layer has a thickness in a range of 25 µm to 100 µm, for example 50 µm.

Figure 1B:
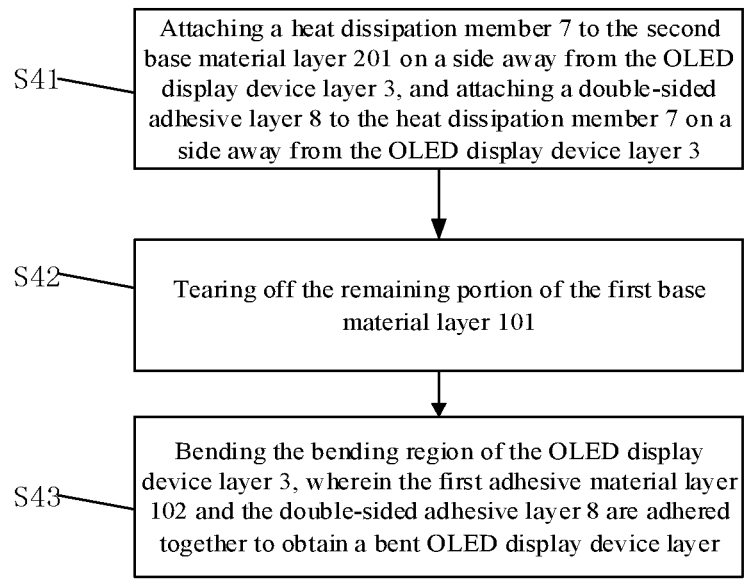
FIG. 1B is a flowchart of steps of a method for manufacturing an OLED display structure after a second base material layer is attached to replace a portion of the first base material layer in a display region according to the embodiment of the present disclosure.
Figure 7:
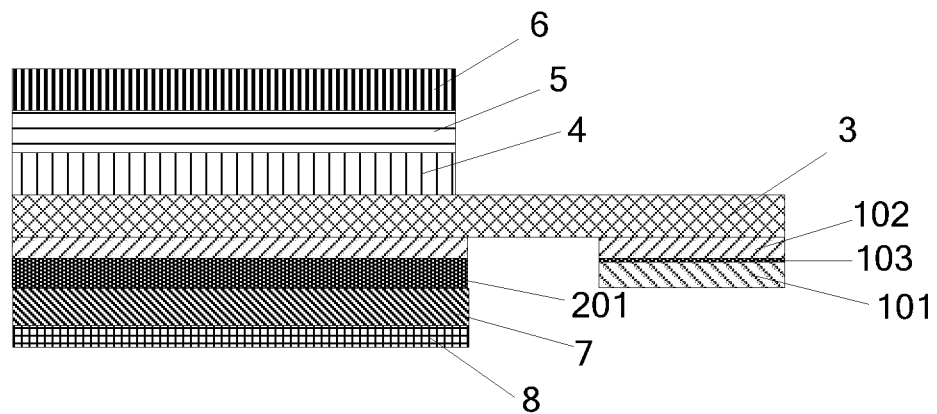
Figure 8:
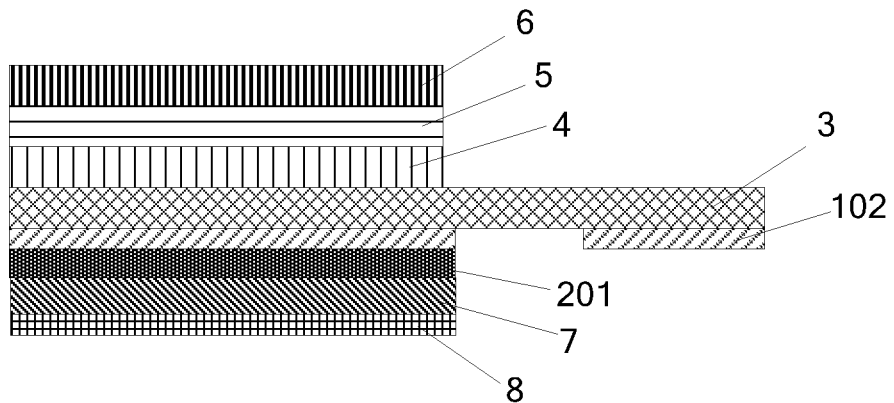
Figure 9:
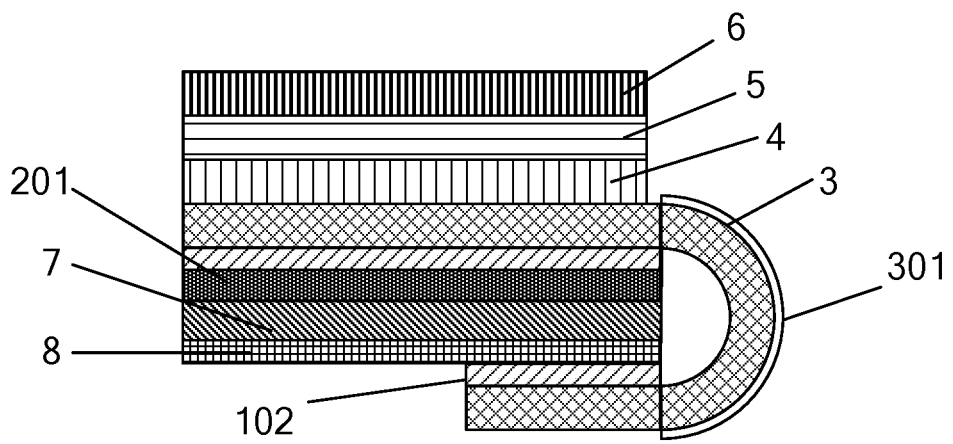

FIG. 1B is a flowchart of steps of a method for manufacturing an OLED display structure after a second base material layer is attached to replace the portion of the first base material layer 101 in the display region according to the embodiment of the present disclosure. Further, as shown in FIG. 1B, after the second base material layer 201 is attached to replace the portion of the first base material layer 101 in the display region, the method for manufacturing an OLED display structure further includes steps of:

Step S41, attaching a heat dissipation member 7 to the second base material layer 201 on a side away from the OLED display device layer 3, and attaching a double-sided adhesive layer 8 to the heat dissipation member 7 on a side away from the OLED display device layer 3, as shown in FIG. 7;

Step S42, tearing off a remaining portion of the first base material layer 101, as shown in FIG. 8;

Step S43, bending the bending region of the OLED display device layer 3 such that the first adhesive material layer 102 and the double-sided adhesive layer 8 are adhered together to obtain a bent OLED display device layer, as shown in FIG. 9; in the embodiment of the present disclosure, as shown in FIG. 8, before bending, an end of the OLED display device layer 3 away from the second base material layer 210 is flush with an end of the first adhesive material layer 102 away from the second base material layer 201.

In the embodiment of the present disclosure, a second adhesive material layer 301 is further attached to an outside of a bent portion of the OLED display device layer 3, and the second adhesive material layer 301 extends from one end to the other end of the bent portion of the OLED display device layer 3, and thus, has a semicircular shape, as shown in FIG. 9.

In the embodiment of the present disclosure, the second adhesive material layer 301 is made of acrylic resin.

In the embodiment of the present disclosure, after bending, the end of the OLED display device layer 3 is still flush with the end of the first adhesive material layer 102, as shown in FIG. 9.

In the embodiment of the present disclosure, the heat dissipation member 7 may be made of stainless steel, Cu, or the like.

As shown in FIGS. 7 to 9, before the OLED display device layer is bent, firstly, the heat dissipation member is attached to the second base material layer, and the double-sided adhesive layer is attached to the heat dissipation member, as shown in FIG. 7. Subsequently, the remaining portion of the first base material layer is torn off, that is, the portion of the first base material layer corresponding to the bending region is torn off, as shown in FIG. 8. The first base material layer is torn off with the adhesive material layer remained, such that the stacking structure formed by bending has a thickness not including the thickness of the first base material layer. In this way, a smaller bending radius and further, the frame with a smaller size may be realized. The first adhesive material layer is remained, such that the bonding between the OLED display device layer and the double-sided adhesive is tougher. After the OLED display device layer is bent, the second adhesive material layer 301 is attached to the outside of the bent portion of the OLED display device layer for protecting circuits in the bending region to avoid any damage. Finally, in such a bent display structure, the regional design of the support material and the frame with a smaller size has been realized.

Further, an opening 104 is provided in the support film, and extends through the first base material layer 101, the first release film 103, and the first adhesive material layer 102. The opening 104 is located at the position that corresponds to the bending region of the OLED display device layer, as shown in FIG. 2 to FIG. 9. The opening 104 is provided, such that portions of the support film in the display region and the bending region are separated from each other, for tearing off the first base material layer more easily. Tearing off the portion of the first base material layer in the display region and tearing off the portion of the first base material layer in the bending region do not affect each other.

Figure 10:
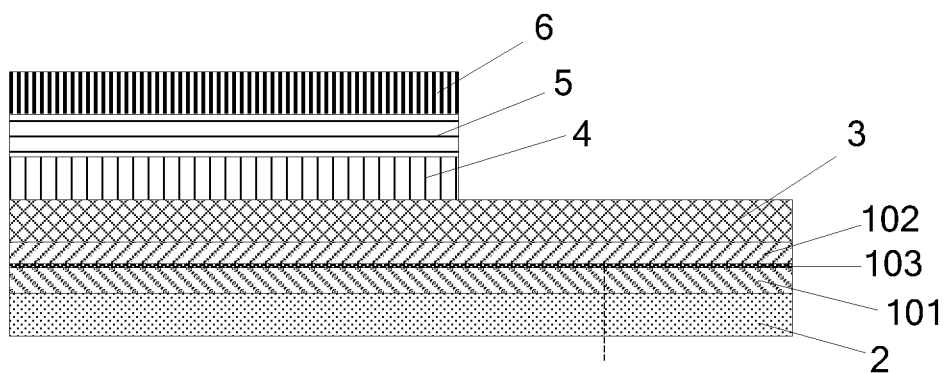
FIGS. 10 to 13 are schematic diagrams illustrating a process for manufacturing an OLED display structure according to an embodiment of the present disclosure, in which a support film has no opening therein.
Figure 11:
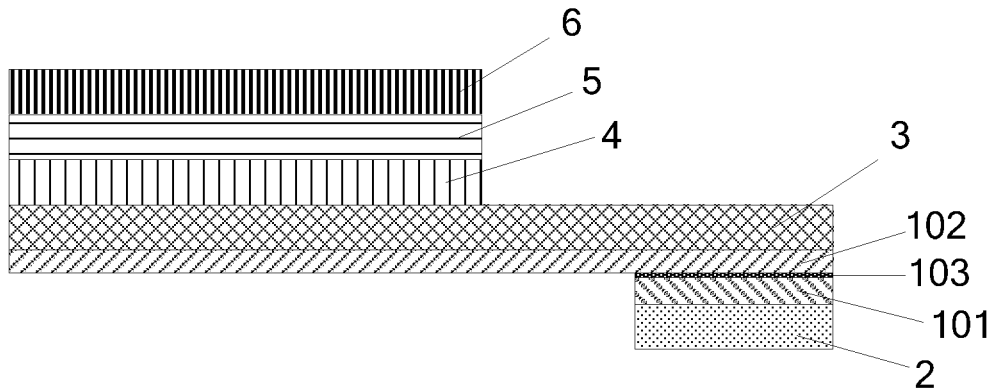
Figure 12:
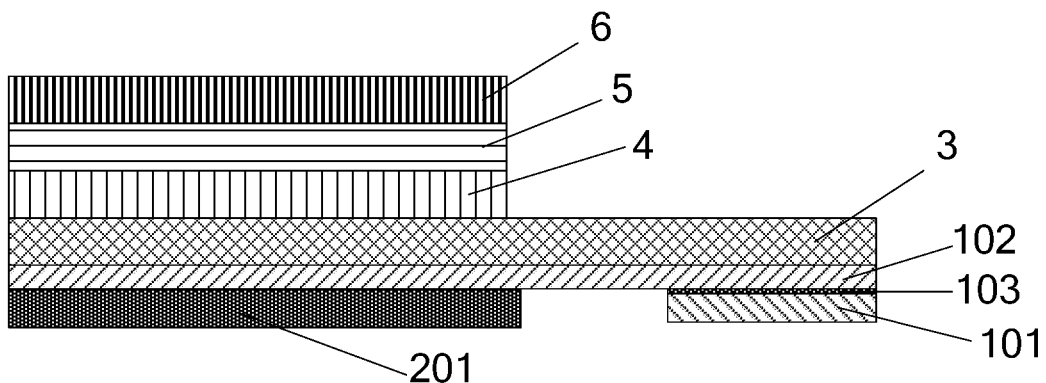

In other embodiments of the present disclosure, the support film has no opening and thus, has a one-piece structure. Before tearing off the portion of the first base material layer in the display region, the support film needs to be subjected to a half-cut process. Specifically, the first base material layer 101 of the support film is cut into: a first portion corresponding to the display region and a portion of the bending region, and a second portion corresponding to a remaining portion of the bending region. As shown in FIG. 10, the first base material layer 101 is cut along the dotted line A-A. Then, the first portion of the first base material layer 101 is torn off, as shown in FIG. 11. The second base material layer 201 is attached to replace the first portion of the first base material layer 101 at a position on the first adhesive material layer corresponding to the display region, as shown in FIG. 12. The second base material layer 201 has a length shorter than that of the torn off first portion, so that a gap exists between the second base material layer 201 and the second portion of the first base material layer 101 which is remained, as shown in FIG. 12. Then, the process steps, such as Steps S41 and S42, are performed on the structure with the attached second base material layer 201, and then, the bending region is bent to obtain a bent OLED display structure, as shown in FIG. 13.

In the embodiment of the present disclosure, as shown in FIG. 12, an end of the OLED display device layer 3 away from the second base material layer 210 is flush with an end of the first adhesive material layer 102 away from the second base material layer 201.

Figure 13:
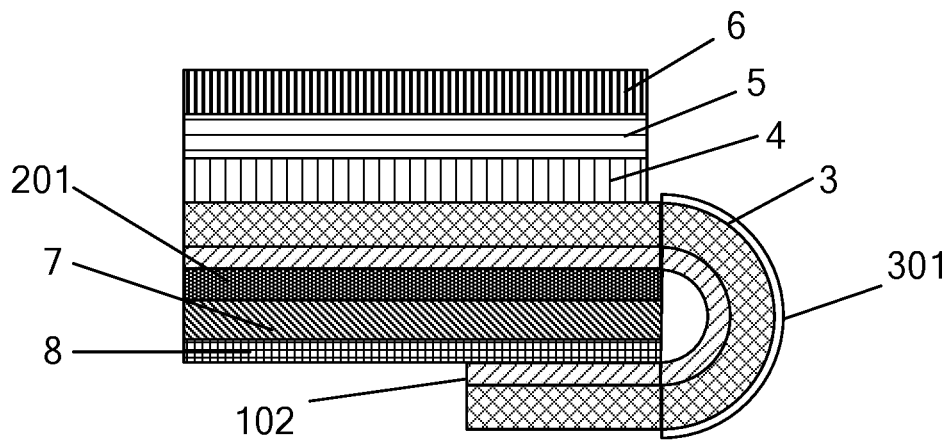

In the embodiment of the present disclosure, a second adhesive material layer 301 is further attached to an outside of a bent portion of the OLED display device layer 3, and the second adhesive material layer 301 extends from one end to the other end of the bent portion of the OLED display device layer 3, and thus, has a semicircular shape, as shown in FIG. 13.

In the embodiment of the present disclosure, after bending, the end of the OLED display device layer 3 is still flush with the end of the first adhesive material layer 102, as shown in FIG. 13.

In the embodiment of the present disclosure, the support film may be subjected to the half-cut process by using a laser.

In this way, when the OLED display device layer is bent, the first adhesive material layer 102 of the support film is still remained in the bending region, so that both sides of the OLED display device layer at the bent region are covered by adhesive materials. That is, the OLED display device layer is sandwiched between two adhesive material layers to protect the circuits, as shown in FIG. 13.

Further, the adhesive force between the first base material layer and the first adhesive material layer is in a range of 5 gf/Inch to 20 gf/Inch, for example in a range of 10 gf/Inch to 15 gf/Inch.

The adhesive force between the protective base material layer and the first adhesive material layer is in a range of 0 to 5 gf/Inch.

According to the embodiment of the present disclosure, the adhesive force between the first adhesive material layer and the first base material layer is in a range of 5 gf/Inch to 20 gf/Inch, for example in a range of 10 gf/Inch to 15 gf/Inch, such that the adhesive force between the adhesive material layer and the base material layer meets requirements to fall within a certain range, thereby meeting the requirement for a peeling-off process better to avoid any risk. In this way, a part of the base material layer of the support film in the display region may be replaced according to a corresponding requirement for the folding/curving design, thereby providing a process route and implementation for forming the regional back film. In the processes for manufacturing the OLED display structure, the support film with the adhesive force in the above range is directly used, such that the requirements for subsequent processes are met better, and the first base material layer is easily torn off from the first adhesive material layer, thereby replacing the first base material layer more conveniently.

In the actual process, it is required to use different support materials according to actual requirements to manufacture the display structure. The support film cannot be regionally processed by a supplier providing the support film, the bonding between the base material and the adhesive material on the existing support film is very tight, and most of the existing back films are not necessarily torn off and replaced. Therefore, in the present disclosure, the base material and the adhesive material in the support film are subjected to the release process to a certain extent, so that the base material may be easily torn off from the support film. In the manufacturing process for the display structure, the base material in the region to be replaced is torn off at any time and is replaced with the base material made of other materials, thereby optimizing the materials in the display region on the display panel. In this way, the requirements of diversification for the display panel may be met, and the display panel is easily manufactured through respective processes.

The present disclosure provides a solution for achieving the regionalization in the factory, where a supplied material is of one piece and processes are stable, and the stability may last until the cover plate has been attached. The film may be directly replaced when a subsequent metal component is to be attached, so that the regional support film is realized, and the whole thickness is reduced. The embodiment of the present disclosure also provides an OLED display structure manufactured by the above method. The OLED display structure of the embodiments of the present disclosure includes the support film described herein. The OLED display structure of the embodiments of the present disclosure may be applied to a full screen design, a folding screen design, a related curved surface design and the like.

The foregoing description is only illustrative of the embodiments of the present disclosure and the principles of the technology employed. It will be appreciated by one of ordinary skill in the art that the scope of the present disclosure is not limited to the technical solution formed by the specific combination of the above technical features, but should also include other technical solutions formed by any combination of the above technical features or their equivalents without departing from the scope of the present disclosure. For example, the above features and the technical features disclosed in the present disclosure (but not limited to) having similar functions can be replaced with each other to form the technical solution.

What is claimed is:

1. A manufacturing method of an OLED display structure, comprising:
   providing a support film such that the support film comprises a first adhesive material layer and a first base material layer stacked together, and a first release film between the first base material layer and the first adhesive material layer;
   attaching the support film to an OLED display device layer, wherein the OLED display device layer comprises a display region and a bending region;
   tearing off a portion of the first base material layer in the display region; and
   attaching a second base material layer at a position on the first adhesive material layer corresponding to the display region where the portion of the first base material layer is torn-off, wherein the second base material layer is made of a different material from that of the first base material layer.

2. The manufacturing method of an OLED display structure of claim 1, wherein
   before tearing off the portion of the first base material layer in the display region, the manufacturing method of an OLED display structure further comprises:
   cutting the first base material layer of the support film into: a first portion corresponding to the display region and a portion of the bending region, and a second portion corresponding to a remaining portion of the bending region; and
   tearing off the first portion;
   wherein the attaching a second base material layer at the position on the first adhesive material layer corresponding to the display region where the portion of the first base material layer is torn-off, comprises: attaching the second base material layer such that the second base material layer and the second portion of the first base material layer are spaced apart from each other by a distance.

3. The manufacturing method of an OLED display structure of claim 2, further comprising:
   forming a protective base material layer a side of the first adhesive material layer away from the first base material layer, and
   forming a protective film on a side of the first base material layer away from the first adhesive material layer,
   wherein before the attaching the support film to the OLED display device layer, the manufacturing method of an OLED display structure further comprises: tearing off the protective base material layer; and
   wherein before the tearing off a portion of the first base material layer corresponding to the display region, the manufacturing method of an OLED display structure further comprises: tearing off the protective film.

4. The manufacturing method of an OLED display structure of claim 1, further comprising:
   forming a protective base material layer a side of the first adhesive material layer away from the first base material layer, and
   forming a protective film on a side of the first base material layer away from the first adhesive material layer,
   wherein before the attaching the support film to the OLED display device layer, the manufacturing method of an OLED display structure further comprises: tearing off the protective base material layer; and
   wherein before the tearing off a portion of the first base material layer corresponding to the display region, the manufacturing method of an OLED display structure further comprises: tearing off the protective film.

5. The manufacturing method of an OLED display structure of claim 1, wherein
   the OLED display device layer comprises a functional film layer, a first optical adhesive layer and a window film layer sequentially arranged in the display region.

6. The manufacturing method of an OLED display structure of claim 1, wherein
   after attaching a second base material layer at the position on the first adhesive material layer corresponding to the display region where the portion of the first base material layer is torn-off, the manufacturing method of an OLED display structure further comprises:

attaching a heat dissipation member to the second base material layer on a side away from the OLED display device layer, and attaching a double-sided adhesive layer to the heat dissipation member on a side away from the OLED display device layer;

tearing off the remaining portion of the first base material layer; and bending the bending region of the OLED display device layer such that the first adhesive material layer and the double-sided adhesive layer are adhered together;

wherein a second adhesive material layer is attached to an outside of a bent portion of the OLED display device layer corresponding to the bending region.

7. The manufacturing method of an OLED display structure of claim 1, wherein the first base material layer is made of polyethylene terephthalate, and the second base material layer is made of metal or polymer.

8. The manufacturing method of an OLED display structure of claim 1, wherein the first base material layer has a thickness in a range of 25 μm to 100 μm.

9. The manufacturing method of an OLED display structure of claim 8, wherein the first base material layer has a thickness of 50 μm.

10. The manufacturing method of an OLED display structure of claim 1, wherein a material of the first release film comprises silicone oil;

a material of the first adhesive material layer comprises acrylic resin; and a material of the first base material layer comprises polyethylene terephthalate.

* * * * *